United States Patent
Dietz

(10) Patent No.: US 12,276,714 B2
(45) Date of Patent: Apr. 15, 2025

(54) GRADIENT COIL UNIT FREE OF ACTIVE SCREENING

(71) Applicant: Siemens Healthcare AG, Forchheim (DE)

(72) Inventor: Peter Dietz, Fürth (DE)

(73) Assignee: Siemens Healthineers AG, Forchheim (DE)

( * ) Notice: Subject to any disclaimer, the term of this patent is extended or adjusted under 35 U.S.C. 154(b) by 103 days.

(21) Appl. No.: 18/215,888

(22) Filed: Jun. 29, 2023

(65) Prior Publication Data
US 2024/0004011 A1   Jan. 4, 2024

(30) Foreign Application Priority Data
Jun. 29, 2022  (DE) .................... 10 2022 206 592.1

(51) Int. Cl.
G01R 33/34 (2006.01)
G01R 33/385 (2006.01)
G01R 33/421 (2006.01)

(52) U.S. Cl.
CPC ....... G01R 33/385 (2013.01); G01R 33/4215 (2013.01)

(58) Field of Classification Search
CPC .............. G01R 33/385; G01R 33/4215; G01R 33/3815
See application file for complete search history.

(56) References Cited

U.S. PATENT DOCUMENTS

| 5,424,643 A | 6/1995 | Morich et al. |
| 6,844,733 B2 * | 1/2005 | Heid .................... G01R 33/385 324/318 |
| 2021/0223339 A1 | 7/2021 | Zou et al. |
| 2021/0231758 A1 | 7/2021 | Bindseil et al. |

OTHER PUBLICATIONS

Heid, O., et al.: "A Novel Concept fpr Gradient Coil and Magnet Integration", ISRM Paper; May 2005.
Zhang, P. et al.: "A Theoretical Framework of Gradient Coil Designed to Mitigate Eddy Currents for a Permanent Magnet MRI System." Technology and Health Care, 2022, Nr. Preprint, pp. 1-14.
Vester, M.; et al.: "A Novel Concept for RF Coil and Gradient Coil Integration", ISRM Paper, May 2005.

* cited by examiner

Primary Examiner — G. M. A Hyder
(74) Attorney, Agent, or Firm — Banner & Witcoff Ltd.

(57) ABSTRACT

A gradient coil unit is described that is designed as a hollow cylinder surrounding a patient receiving region in the longitudinal direction and is subdivisible into four quadrants, comprising a primary coil including a conductor structure that includes a geometric arrangement of an electrical conductor with a conductor cross-section arranged within a quadrant of the four quadrants. The quadrant comprises at least one neutral region, which is defined in the longitudinal direction between a first longitudinal position and a second longitudinal position, and characterized in that the current density averaged over the neutral region is less than 25% of the maximum current density averaged over the conductor cross-section within the neutral region. The gradient coil unit is free of a secondary coil and/or free of an active screening.

18 Claims, 4 Drawing Sheets

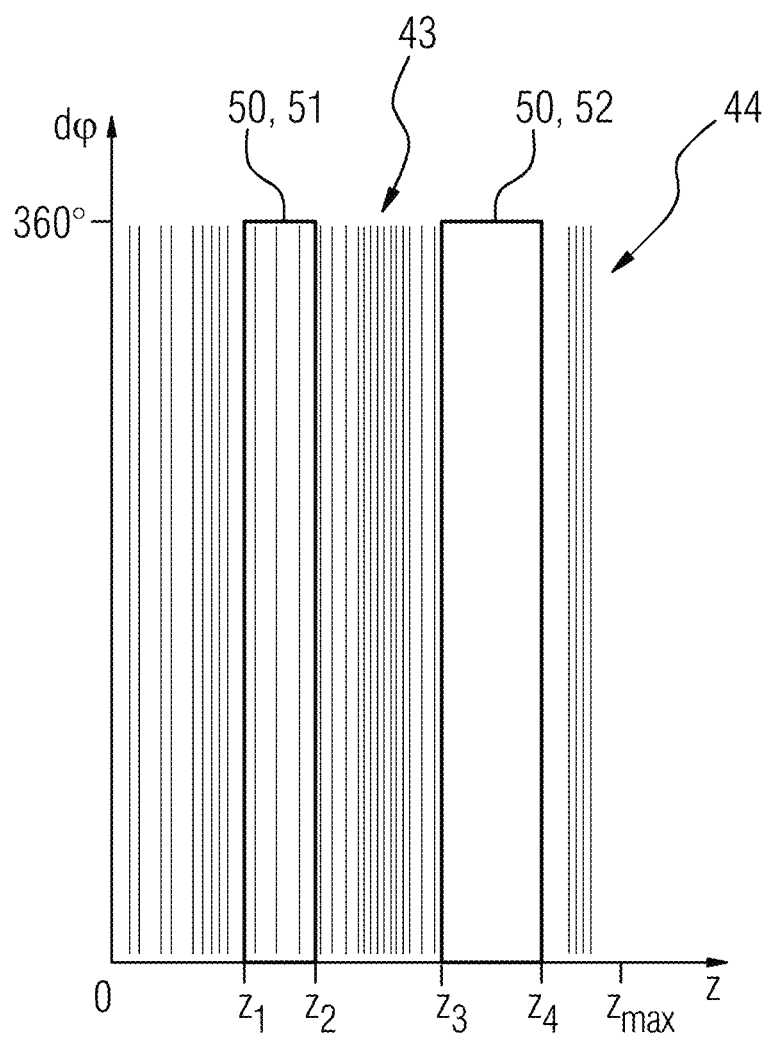

GRADIENT COIL UNIT FREE OF ACTIVE SCREENING

CROSS-REFERENCE TO RELATED APPLICATIONS

The present application claims priority to and the benefit of Germany patent application no. DE 10 2022 206 592.1, filed on Jun. 29, 2022, the contents of which are incorporated herein by reference in their entirety.

TECHNICAL FIELD

The disclosure relates to a gradient coil unit without active screening for use in a magnetic resonance device and a magnetic resonance device comprising such a gradient coil unit.

BACKGROUND

In a magnetic resonance device, the body of an examination object to be examined, particularly that of a patient, is typically exposed with the aid of a main magnet, in particular a magnet unit, to a relatively strong main magnetic field of, for example, 0.55, 1.5, 3, 7, etc. tesla. In addition, gradient pulses are applied with the aid of a gradient coil unit. By means of a radio frequency antenna unit, using suitable antenna apparatuses, high frequency radio frequency pulses, for example excitation pulses, are then emitted, which has the effect that the nuclear spins of particular atoms excited into resonance by these radio frequency pulses are tilted by a defined flip angle relative to the magnetic field lines of the main magnetic field. On relaxation of the nuclear spins, radio frequency signals, so-called magnetic resonance signals are emitted and are received by means of suitable radio frequency antenna and further processed. From the raw data thereby acquired, the desired image data can finally be reconstructed.

A gradient coil unit conventionally comprises three primary coils and three secondary coils corresponding thereto. The three primary coils are typically included by a primary coil unit. The three secondary coils are typically included by a secondary coil unit.

A primary coil is typically designed for generating a magnetic field gradient in one spatial direction. A magnetic field gradient is typically a first order and/or linear order magnetic field, in particular a magnetic field the amplitude of which rises in a linear manner along a spatial direction. In the driving of a primary coil, leakage fields are generated outside the gradient coil unit, said leakage fields interacting with conductive structures surrounding the gradient coil unit, whereby eddy currents arise. These eddy currents firstly generate ohmic heating which can cause a quenching of a superconducting coil unit included by the magnet unit. In addition, the eddy currents themselves generate a magnetic field, a so-called eddy current field, which can negatively influence the quality of image data.

Conventionally, the leakage fields and eddy currents are suppressed by way of secondary coils, wherein associated with each primary coil is a corresponding secondary coil. If the primary coil generates a leakage field, the secondary coil, which corresponds to the primary coil, is designed to generate a magnetic field directed contrary to the leakage field, said magnetic field acting, in particular, outside the patient receiving region. For this purpose, the secondary coil conventionally has a conductor structure similar to the first primary coil, which is controlled similarly to the primary coil, with an inverted sign as compared with the primary coil, and thereby mainly generates a first order magnetic field that is directed opposing the magnetic field gradient generated by the primary coil. Outside the patient receiving region, the magnetic fields generated by the primary coil and the secondary coil typically overlay one another destructively. Conventionally, a gradient coil unit typically comprises a secondary coil unit comprising three secondary coils, wherein a secondary coil is associated with each primary coil. The primary coils and the secondary coils are conventionally controlled with electric currents, the amplitudes of which reach up to 1 kA, and undergo frequent and rapid changes in the current direction with rise and fall rates of more than 100 kA/s. The driving voltage for the coil current is up to several kV.

The secondary coils therein need space so that a gradient coil unit with secondary coils has a smaller internal diameter than a gradient coil unit without secondary coils, so that the patient receiving region becomes narrower. In addition, the active screening, i.e. the driving of the secondary coils, requires a large amount of energy which must be provided in the form of current and voltage by way of gradient amplifiers. Gradient coil units without active screening, i.e. without secondary coils, are therefore advantageous with regard to the size of the patient receiving region and the energy consumption, provided the eddy currents and/or eddy current fields relating to the magnet unit and/or the superconducting coil unit can be compensated out.

SUMMARY

It is an object of the disclosure to provide a gradient coil unit without active screening, which generates reduced and/or controlled eddy current fields and eddy currents. This object is achieved by way of the embodiments described herein, including those described in the claims.

The gradient coil unit according to the disclosure is designed as a hollow cylinder surrounding a patient receiving region in the longitudinal direction and subdivisible into four quadrants. The gradient coil unit according to the disclosure comprises a primary coil comprising a conductor structure, which comprises a geometrical arrangement of an electrical conductor with a conductor cross-section arranged within one quadrant of the four quadrants, wherein the quadrant has at least one neutral region which is defined between a first longitudinal position and a second longitudinal position in the longitudinal direction, and is characterized in that the current density averaged over the neutral region is less than 25% of the maximum current density averaged over the conductor cross-section within the neutral region. The gradient coil unit according to the disclosure is free of a secondary coil and/or an active screening.

The conductor structure typically comprises the electrical conductor. The conductor structure is typically arranged on a cylinder and is saddle-shaped. The conductor structure is typically spatially limited by a quadrant of the gradient coil unit. The conductor structure may be e.g. arranged at least partially spiral-shaped. The conductor structure may be e.g. part of the primary coil, which typically comprises the conductor structure fourfold, each arranged in one quadrant of the four quadrants, and the primary coil is configured to generate a magnetic field gradient in a spatial direction. The neutral region is typically a segment and/or portion and/or part and/or region of the conductor structure arranged within the quadrant, which may be e.g. physically and/or visibly and/or materially not restricted and/or not emphasized. The neutral region is typically defined between the first longitudinal position and the second longitudinal position, wherein the neutral region can be free of any restriction in the circumferential direction. The electrical conductor may e.g. comprise a wire and/or a cable, which follows a predefined geometrical arrangement and/or is fixed according to a predefined geometrical arrangement. The conductor cross-section typically defines the area of the electrical conductor perpendicularly to the longitudinal extent thereof. The conductor cross-section may vary by any suitable proportion (e.g. less than 5%, 10%, etc.) for the conductor structure within the quadrants.

The maximum current density averaged over the conductor cross-section within the neutral region and the current density averaged over the neutral region typically relate to a driving of the conductor structure for the same current density, e.g. at a nominal current strength. A gradient control unit is typically configured to generate the nominal current strength in the conductor structure. The maximum current density averaged over the conductor cross-section typically corresponds to the nominal current density divided by the lowest conductor cross-section of the conductor structure within the neutral region. The current density averaged over the neutral region preferably corresponds to the total of the nominal current density in the conductor structure within the neutral region, taking account of the vectors thereof and/or the vector quantity thereof, e.g. the direction thereof within the neutral region defined by the conductor structure. The current density averaged over the neutral region may be any suitable proportion (e.g. less than 25%, less than 15%, less than 10%, etc.) of the maximum current density averaged over the conductor cross-section within the neutral region. The current density averaged over the neutral region can also be less than any suitable percentage (e.g. 5%) of the maximum current density averaged over the conductor cross-section within the neutral region. Within the neutral region, at least one spacing between two adjacent conductors of the conductor structure can be any suitable spacing such as e.g. between 3 cm and 12 cm, between 5 cm and 11 cm, between 7 cm and 10 cm, etc. Outside the neutral region, at least one spacing between two adjacent conductors of the conductor structure may also be any suitable spacing such as e.g. between 0.1 cm and 2.5 cm, between 0.5 cm and 2 cm, between 0.7 cm and 1.0 cm, etc.

Despite a lack of active screening, e.g. despite the lack of a secondary coil unit, a gradient coil unit having such a conductor structure enables control via an eddy current field arising during driving of the gradient coil unit and a minimization of eddy currents arising on a magnet unit and/or a superconducting coil unit. For instance, the gradient coil unit according to the disclosure enables a larger patient receiving region and/or a reduced energy consumption as compared with conventional actively screened gradient coil units and/ or gradient coil units having a secondary coil unit.

One embodiment of the gradient coil unit provides that the neutral region is designed as a first neutral region, and the spatial density of the electrical conductor within the first neutral region is greater than the spatial density of the electrical conductor averaged over the quadrants, and the conductor structure is configured such that on driving the conductor structure, an electric current perpendicularly to the longitudinal direction within the first neutral region at least partially has an opposite direction. Parts of the conductor structure which have an opposite direction within the first neutral region typically belong to different conductor circuits. The spatial density of the electrical conductor within the first neutral region may denote the volume occupied by the electrical conductor of the first neutral region relative to the first neutral region.

The spatial density of the electrical conductor averaged over the quadrant may denote the volume of the quadrant occupied by the electrical conductor relative to the quadrant. The spatial density of the electrical conductor within the first neutral region may be any suitable value such as e.g. at least double, at least three times, at least four times, etc. as great as the spatial density of the electrical conductor averaged over the quadrant. The conductor structure within the first neutral region is therefore typically designed such that the geometrical arrangement of the electrical conductor provides particularly small intermediate spaces and/or spacings between the electrical conductor.

The conductor structure within the first neutral region is designed according to this embodiment such that, for instance, on driving the conductor structure, e.g. with a nominal current strength, an electric current is generated perpendicularly to the longitudinal direction, e.g. in the circumferential direction, wherein it is directed perpendicularly to the longitudinal direction at least partially opposingly. For instance, a first part of the conductor structure within the first neutral region can be designed such that during driving, an electric current is directed in the positive circumferential direction, that is, for example, for dφ from 0° to 180°, and a second part of the conductor structure within the first neutral region can be designed such that during driving, an electric current is directed in the negative circumferential direction, that is for example, for dφ from 1800 to 0°. The conductor structure is typically designed so that the number of electrical conductors directed in the positive circumferential direction differs by any suitable value, such as e.g. not more than 25%, not more than 20%, not more than 15%, etc. of the electrical conductors directed in the negative circumferential direction, e.g. with a constant conductor cross-section. A current density of the electrical conductors directed in the positive circumferential direction typically at least partially neutralizes the amount of a current density of the electrical conductors directed in the negative circumferential direction to the current density averaged over the first neutral region. By this means, the current density averaged over the first neutral region within the first neutral region can be efficiently reduced.

Electrical conductors extending in the opposite direction within the first neutral region typically have different radial orientations and/or at least partially spirally surround mutually different central points. The first neutral region may be free of a central point which is at least partially spirally surrounded by the electrical conductor. The conductor structure diverges in the circumferential direction at and/or in the direction of dφ=0° and/or dφ=180°. A driving of the conductor structure, e.g. also the part of the conductor structure included by the first neutral region and/or within the first neutral region, generates a leakage field which induces eddy currents in a conductive structure outside the gradient coil unit, provided the spacing of the conductive structure from the first neutral region is sufficiently small. However, the reduced current density averaged over the first neutral region according to this embodiment enables a reduction in eddy currents arising due to the leakage field, e.g. if the conductive structure is limited in the longitudinal direction. Taking account of the direction of an electric current within the first neutral region and a minimization of the sign-laden sum of the electric current, e.g. perpendicularly to the longitudinal direction, enables a minimization of an eddy current on a conductive structure outside the gradient coil unit, e.g. if the conductive structure is limited in the longitudinal direction, such as, for example, ring structures, for example as part of a passive screening unit.

One embodiment of the gradient coil unit provides that the first longitudinal position of the first neutral region has any suitable spacing, such as e.g. between 15 cm and 25 cm, between 17 cm and 23 cm, etc. from the central plane and/or the second longitudinal position of the first neutral region has any suitable spacing, such as e.g. between 25 cm and 35 cm, between 27 cm and 33 cm, etc. from a central plane of the gradient coil unit.

The central plane typically defines a plane perpendicularly to the longitudinal direction, which bisects the gradient coil unit and/or the hollow cylinder in the longitudinal direction. The central plane can be defined, for instance, as the central plane of the gradient coil unit perpendicularly to the longitudinal direction.

For example, the first longitudinal position of the first neutral region may have a spacing of 20 cm from the central plane, and the second longitudinal position of the first neutral region may have a spacing of 30 cm from the central plane. Thus, the gradient coil unit may be designed to generate a particularly even magnetic field gradient in the region from −20 cm to +20 cm spatial extent in the longitudinal direction about the central plane, e.g. in the examination region. Conventional conductor structures of conventional gradient coil units have, for this purpose, a central point at a spacing of between 20 cm and 30 cm from the central plane, which is surrounded at least partially spirally in this region by an electrical conductor and can form an "eye." By this means, a strong focusing of the radial leakage field, e.g. the radial eddy current field, takes place and, consequently, a particularly high density of eddy currents on conductive structures that are exposed to the eddy current field.

This embodiment enables a generation of an even magnetic field gradient in the examination region, wherein in the region in which, conventionally, particularly large radial leakage fields arise, the eddy current fields caused by a leakage field on corresponding conductive structures are minimized.

One embodiment of the gradient coil unit provides that a spacing of the first longitudinal position and/or of the second longitudinal position and/or of a mean value of the first longitudinal position and the second longitudinal position of the first neutral region from a central plane of the gradient coil unit is smaller than at a longitudinal end of the gradient coil unit delimiting the quadrants. The spacing of the first neutral region is thus arranged closer to an isocenter and/or a spatial central point of the gradient coil unit than to a longitudinal end. This ensures a reliable and robust control of the eddy current fields and the eddy currents. An explicit compensation for a force typically does not take place.

One embodiment of the gradient coil unit provides that the conductor structure surrounds a first central point and a second central point, each at least partially spirally, and the first central point and the second central point are arranged outside the first neutral region. The first central point and the second central point are typically arranged within the quadrants. The first central point and the second central point typically have different positions in the longitudinal direction. The first central point and the second central point typically have a central position in the circumferential direction within the quadrants, e.g. at dφ=90°. The first central point and the second central point are typically arranged such that at their positions in the longitudinal direction, no superconducting coil unit included by the magnet unit radially surrounding the gradient coil unit is provided. The superconducting coil unit may thus be free of a magnet coil at a position in the longitudinal direction at which position the first central point and/or the second central point is arranged. A gradient coil unit of this type enables focusing of the leakage fields and/or of eddy currents and eddy current fields arising to defined regions with good homogeneity of the magnetic field gradients generated.

One embodiment of the gradient coil unit provides that the neutral region is designed as a second neutral region, and the spatial density of the electrical conductor within the second neutral region is less than the spatial density of the electrical conductor averaged over the quadrants.

The second neutral region is therefore characterized in that a current density averaged over the second neutral region is kept low, in that the conductor structure in the second neutral region provides more than average space between the electrical conductor and/or the conductor structure takes up less than average space of the second neutral region. This embodiment therefore enables a small leakage field, e.g. in the region between the first longitudinal position and the second longitudinal position when driving the gradient coil unit, which therefore enables a reduction in eddy currents radially outside the second normal region.

One embodiment of the gradient coil unit provides that the second neutral region has any suitable spacing of e.g. less than 15 cm, less than 12 cm, etc. from the central plane or a spacing of e.g. more than 45 cm, more than 50 cm, etc. from the central plane. These spacings enable a particularly good reduction of leakage fields and/or eddy currents in the region of a superconducting coil unit and/or in the region of the examination region which can have a negative influence on an image quality and/or on a heating of the superconducting coil unit. The gradient coil unit may also comprise a second neutral region twice within a quadrant, wherein the two second neutral regions differ from one another in their longitudinal positions.

One embodiment of the gradient coil unit provides that the at least one neutral region included by the quadrant comprises a neutral region is designed as a first neutral region and at least one neutral region is designed as a second neutral region. This embodiment enables an individual control of the leakage fields and/or eddy current fields arising during the driving of the gradient coil unit. By this means, e.g. individual regions of a magnet unit surrounding the gradient coil unit that are sensitive with respect to eddy current fields and/or eddy currents can be taken into account readily in the design of the gradient coil unit, so that eddy current fields and/or eddy currents are suppressed in these regions and/or concentrated outside these regions. The first neutral region and the second neutral region may be spaced by any suitable value, e.g. at least 5 cm, at least 10 cm, etc. from one another in the longitudinal direction. The first central point and/or the second central point may be for example arranged between the first neutral region and the second neutral region of the first central point.

One embodiment of the gradient coil unit provides that the primary coil is designed for generating a magnetic field gradient in a direction perpendicular to the longitudinal direction. This embodiment therefore enables control of the eddy current fields and/or eddy currents, e.g. also when magnetic field gradients are generated in the x-direction and in the y-direction, which are typically created by complex saddle-shaped conductor structures. The primary coil may e.g. comprise a first neutral region and at least one second neutral region.

One embodiment of the gradient coil unit provides that the gradient coil unit and/or the primary coil is point-symmetrical to an intersection point of the four quadrants and/or the primary coil comprises the conductor structure fourfold, wherein each of the four conductor structures is arranged within a quadrant. Typically, four conductor structures in quadrants arranged symmetrically to one another are required to generate a magnetic field gradient in the x-direction or in the y-direction. Such a gradient coil unit may be e.g. driven by way of a gradient control unit, e.g. by way of a gradient amplifier unit included by the gradient control unit, for example by way of electric currents with amplitudes of up to 1 kA.

One embodiment of the gradient coil unit provides that the gradient coil unit additionally comprises a further primary coil comprising a further electric conductor, which further electrical conductor surrounds a cylinder axis of the hollow cylinder at least partially spirally with a first radius, wherein the first radius differs by not more than any suitable value such as e.g. not more than 5 cm, not more than 3 cm, by not more than 2.5 cm, etc. from the spacing of the conductor structure from the cylinder axis, wherein the spatial density of the further electrical conductor within the neutral region is less than the spatial density of the further electrical conductor averaged over the quadrants.

The further primary coil is typically designed for generating a magnetic field gradient in the longitudinal direction. The further primary coil may be e.g. integrated into the hollow cylinder of the gradient coil unit. The arrangement of the further electrical conductor is configured by way of the selection of the relatively low spatial density of the further electrical conductor within the neutral region, e.g. such that in the neutral region, starting from the further electrical conductor, a smaller leakage field is generated than outside the neutral region, whereby eddy currents and/or eddy current fields emerging from the entire gradient coil unit in the neutral region and/or spaced radially therefrom are readily controllable.

Furthermore, the disclosure proceeds from a magnetic resonance device comprising a hollow cylindrical magnet unit designed for creating a static main magnetic field comprising a superconducting coil unit, which comprises at least two magnet coils and a gradient coil unit according to the disclosure arranged in a hollow region of the magnet unit, wherein a first magnet coil of the at least two magnet coils is arranged in the longitudinal direction at least partially between the first longitudinal position and the second longitudinal position and surrounds the patient receiving region.

The first magnet coil and/or a second magnet coil of the at least two magnet coils may be e.g. arranged in the longitudinal direction at least partially within the neutral region. The first magnet coil and/or the second magnet coil surround the neutral region may be e.g. at least partially radially. The magnetic resonance device according to the disclosure enables, during driving of the gradient coil unit, minimized and/or reduced and/or optimized leakage fields and/or eddy currents at least in the region of the first magnet coil. The magnetic resonance device according to the disclosure enables, during driving of the gradient coil unit, minimized and/or reduced and/or optimized eddy currents in the region of the first magnet coil, e.g. on a conductive structure radially arranged between the first magnet coil and the primary coil.

At a radial spacing from regions of the gradient coil unit that lie outside a neutral region included by the gradient coil unit, the magnet unit is typically free of a magnet coil. In such regions outside a neutral region included by the gradient coil unit, leakage fields of the gradient coil unit may be concentrated and focused, so that no eddy currents can arise in the region of magnet coils and a mode of operation of the magnet unit is not impaired.

One embodiment of the magnetic resonance device additionally comprises a passive screening unit, which is arranged radially between the gradient coil unit and the superconducting coil unit, and comprises at least one ring structure that is arranged at least partially between the first longitudinal position and the second longitudinal position. The ring structure typically has a shorter spatial extent in the longitudinal direction than the magnet unit. The spatial extent of the ring structure in the longitudinal direction typically differs from the spatial extent of the first magnet coil by not more than any suitable value, such as e.g. not more than 20%, by not more than 10%, etc. The ring structure may e.g. comprise conductive material. The spatial extent of the ring structure in the longitudinal direction typically differs from the spatial extent of the neutral region by not more than any suitable value, such as e.g. not more than 20%, by not more than 10%, etc. The limited spatial extent of the ring structure in the longitudinal direction limits a propagation of eddy currents induced in the ring structure by the gradient coil unit and minimizes a generation of eddy current fields. By reason of the conductor structure of the gradient coil unit according to the disclosure, during driving of the gradient coil unit, leakage fields arising in the neutral region and thus eddy currents arising in the region of the first magnet coil are greatly reduced as compared with conventional gradient coil units. If, according to the longitudinal position of the neutral region, a ring structure is additionally arranged between the gradient coil unit and the first magnet coil, then the first magnet coil can be very efficiently screened against leakage fields despite the lack of a secondary coil unit and/or active screening of the gradient coil unit and/or the formation of eddy currents on the first magnet coil can be reduced.

The advantages of the magnetic resonance device according to the disclosure substantially correspond to the advantages of the gradient coil unit according to the disclosure, as described in detail above. Features, advantages or alternative embodiments mentioned herein can also be transferred to the other claimed subject matter and vice versa.

BRIEF DESCRIPTION OF THE DRAWINGS

Further advantages, features and details of the disclosure will become apparent from the description below of exemplary embodiments and from the drawings.

In the drawings:

FIG. 5 shows an embodiment of an example further primary coil of a gradient coil unit according to the disclosure.

DETAILED DESCRIPTION OF THE DISCLOSURE

Figure 1:
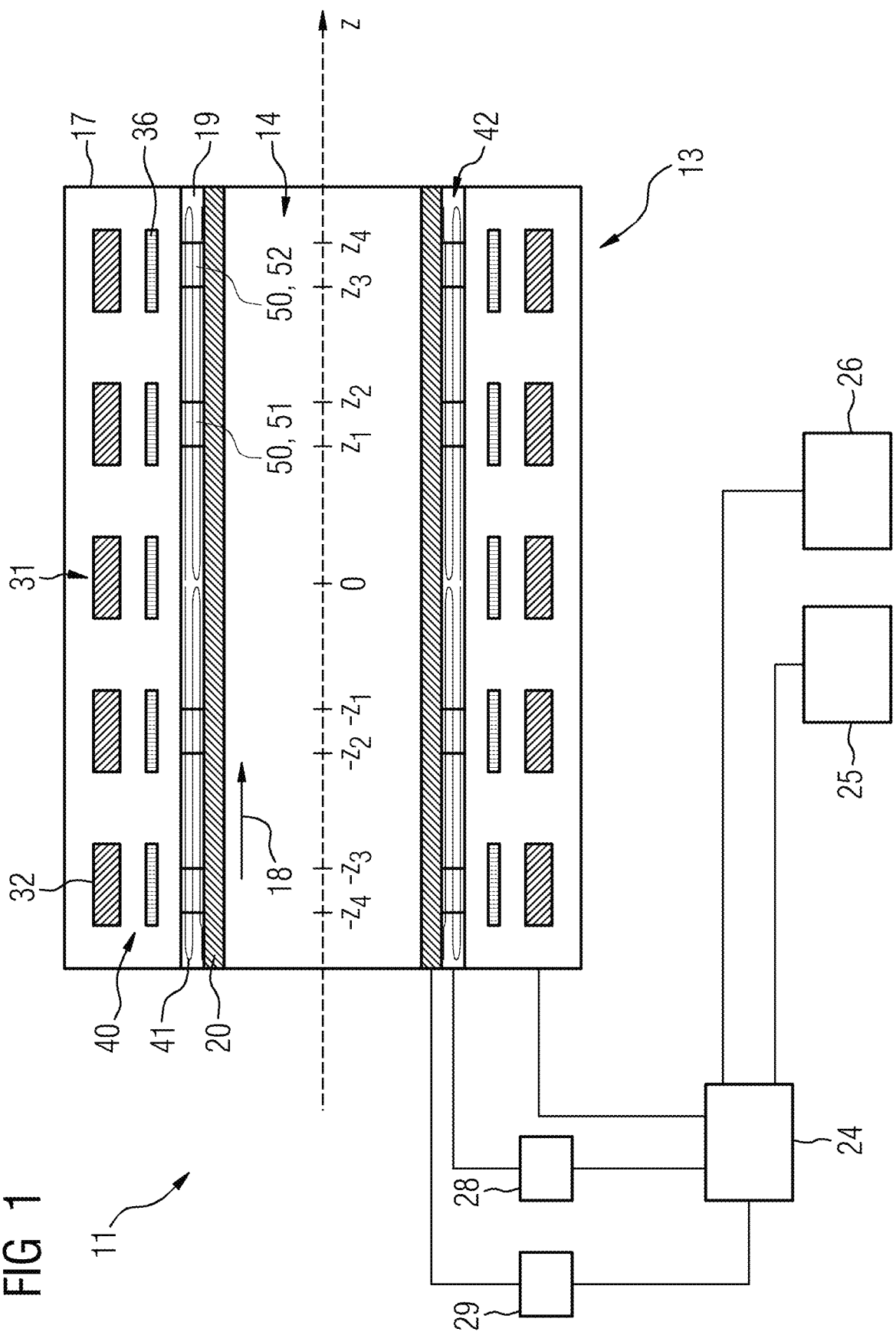
FIG. 1 shows an example magnetic resonance device according to the disclosure in a schematic representation.

FIG. 1 shows an example magnetic resonance device 11 according to the disclosure, comprising a detector unit which comprises a hollow cylindrical magnet unit 13, a gradient coil unit 19 according to the disclosure, and a radio frequency antenna unit 20 in a schematic representation. The detector unit is typically designed to be hollow cylinder-shaped. In addition, the magnetic resonance device 11 has a cylindrical patient receiving region 14, wherein the patient receiving region 14 is cylindrically surrounded in a circumferential direction by the detector unit. A patient can be pushed into the patient receiving region 14 by means of a patient positioning apparatus. The cylinder axis z of the patient receiving region 14 in the longitudinal direction corresponds to the cylinder axis z of the detector unit, e.g. also the cylinder axis z of the magnet unit 13, of the gradient coil unit 19, and of the radio frequency antenna unit 20 in the longitudinal direction.

The magnet unit 13 comprises a hollow cylindrical vacuum container 17 surrounding the cylindrical patient receiving region 14. Arranged within the hollow cylindrical vacuum container 17 is a superconducting coil unit 31, which is configured to generate a strong and, in particular, constant and static main magnetic field 18. In addition, the magnet unit 13 comprises ring structures 36 made of conductive material, which are designed as hollow cylinder-shaped. The superconducting coil unit 31 comprises at least two, in the case shown five, magnet coils 32, which at least partially overlap the ring structures 36 in the longitudinal direction z. In an embodiment, at least one ring structure 36 and at least one magnet coil 32 are arranged in the longitudinal direction z at least partially between the first longitudinal position z1 and the second longitudinal position z2.

The gradient coil unit 19 may comprise a primary coil 41 configured to generate a magnetic field gradient in the x-direction, a primary coil 41 designed configured to generate a magnetic field gradient in the y-direction and a further primary coil 44 configured to generate a magnetic field gradient in the z-direction. The gradient coil unit 19 is free of an active screening, e.g. the gradient coil unit 19 is free of an actively driven secondary coil unit. The gradient coil unit 19 is designed hollow cylinder-shaped and is arranged between the magnet unit 13 and the patient receiving region 14.

The primary coil 41 comprises a conductor structure 42 with a geometric arrangement of an electrical conductor with a conductor cross-section, said conductor structure 42 being arranged within a quadrant. The conductor structure 42, e.g. the entire primary coil 41, all the primary coils included by the gradient coil unit 19 and/or the gradient coil unit 19, etc., additionally has a neutral region 50, 51, 52, which is characterized in that the current density averaged over the neutral region is less than 25% of the maximum current density averaged over the conductor cross-section within the neutral region 50, 51, 52. The neutral region 50, 51, 52 comprises a first neutral region 51, which is delimited by a first longitudinal position z1 and a second longitudinal position z2 along the longitudinal axis, that is, by planes perpendicular to the first longitudinal position z1 and to the second longitudinal position z2. The neutral region 50, 51, 52 comprises a second neutral region 52, which is delimited by a further first longitudinal position z3 and a further second longitudinal position z4 along the longitudinal axis, that is, by planes perpendicular to the further first longitudinal position z3 and to the further second longitudinal position z4. The gradient coil unit 19 is driven by means of a gradient control unit 28.

Furthermore, the magnetic resonance device 11 has a radio frequency antenna unit 20 which, in the case shown, is designed as a body coil permanently integrated into the magnetic resonance device 11, and a radio frequency antenna control unit 29 for an excitation of a polarization, which occurs in the main magnetic field 18 generated by the magnet unit 13. The radio frequency antenna unit 20 is driven by the radio frequency antenna control unit 29 and radiates radio frequency pulses into an examination space, which is substantially formed by the patient receiving region 14.

For controlling the magnet unit 13, the gradient control unit 28, and the radio frequency antenna control unit 29, the magnetic resonance device 11 has a control unit 24. The control unit 24 centrally controls the magnetic resonance device 11, for example, to execute MR control sequences. In addition, the control unit 24 comprises a reconstruction unit (not disclosed in detail) for reconstructing medical image data that is acquired during the magnetic resonance examination. The magnetic resonance device 11 has a display unit 25. Control information such as, for example, control parameters and reconstructed image data can be displayed on the display unit 25, for example on at least one monitor, for a user. In addition, the magnetic resonance device 11 has an input unit 26 by means of which information and/or control parameters can be input by a user during a scanning procedure. The control unit 24 can comprise the gradient control unit 28 and/or the radio frequency antenna control unit 29 and/or the display unit 25 and/or the input unit 26.

The magnetic resonance device 11 may comprise further components that magnetic resonance devices 11 typically have. A general functional method of a magnetic resonance device 11 is also known to a person skilled in the art, so that a detailed description of the further components is omitted.

Figure 2:
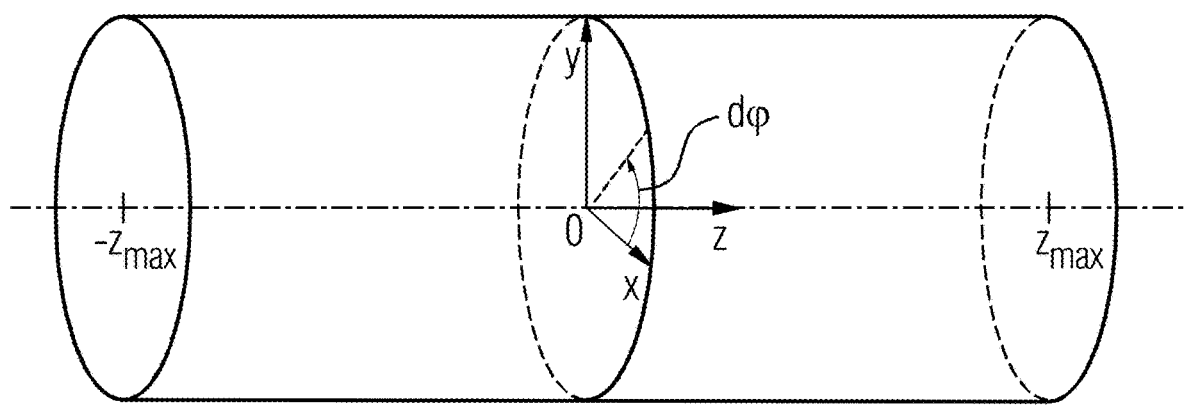
FIG. 2 shows a schematic representation of an example cylinder to explain parameters.

FIG. 2 shows a schematic representation of a cylinder to explain parameters of the gradient coil unit 19. The cylinder axis corresponds to the longitudinal direction z, e.g. the longitudinal direction z of the gradient coil unit 19. The circumferential direction can be characterized by dφ. The direction perpendicular to the circumferential direction dφ is designated the radial direction. The x-direction denoted with x is typically perpendicular to the longitudinal direction z and is oriented horizontally. The y-direction denoted with y is typically perpendicular to the longitudinal direction z and is oriented vertically. The gradient coil unit 19 is delimited at the longitudinal ends by planes perpendicular to the longitudinal axis z at $\pm z_{max}$. A central plane of the gradient coil unit 19 can denote a plane perpendicular to the longitudinal axis z at z=0. A quadrant of the gradient coil unit 19 is typically defined by $[0°, \pm z_{max}]$ along the longitudinal direction and $[0°, +/-180°]$ in the circumferential direction dφ, whereby the gradient coil unit 19 is subdivisible into four quadrants.

Figure 3:
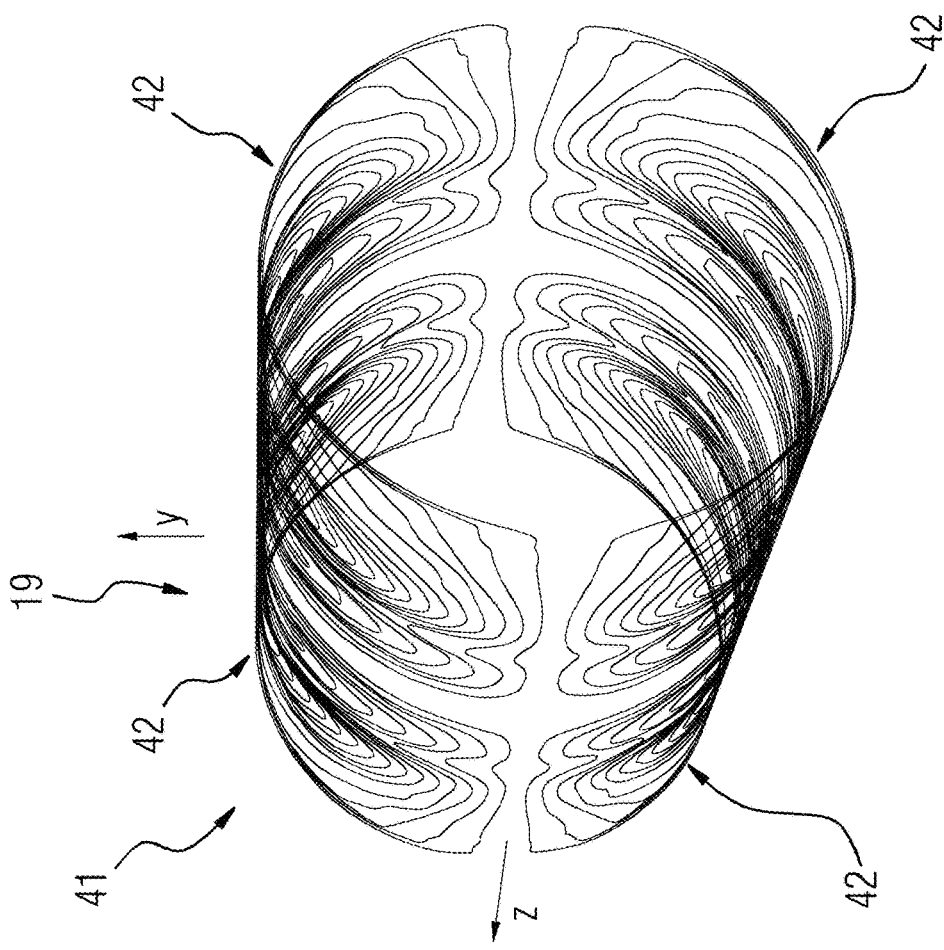
FIG. 3 shows a first embodiment of an example conductor structure of a gradient coil unit according to the disclosure.

FIG. 3 shows a first embodiment of an example conductor structure 42 of a gradient coil unit 19 according to the disclosure arranged within a quadrant, which is represented in the circumferential direction in an unrolled form, that is for dφ=[0°, 180°]. A primary coil 41 comprising such a conductor structure 42 is typically designed for generating a magnetic field gradient in a direction perpendicular to the longitudinal direction z. The neutral region 50 included by the quadrant comprises a first neutral region 51 and a second neutral region 52.

The first neutral region 51 is designed such that the spatial density of the electrical conductor within the first neutral region 51 is greater than the spatial density of the electrical conductor averaged over the quadrants. The conductor structure 42 is designed such that during driving of the conductor structure 42, an electric current perpendicular to the longitudinal direction z within the first neutral region 51, e.g. at dφ=90° has an opposite direction. In other words, the conductor structure is configured such that, upon being driven, at least a portion of electric currents perpendicular to the longitudinal direction within the first neutral region 51, which that are carried by conductors within the conductor structure 42, have an opposite direction with respect to one another.

That is, when driven, the electric current in one portion of the electrical conductor is opposite to the electric current in another portion of the electrical conductor within the first neutral region 51 and perpendicular to the longitudinal direction. The first longitudinal position z1 of the first neutral region 51 has any suitable spacing of e.g. between 15 cm and 25 cm, between 17 cm and 23 cm, etc. from the central plane at z=0. The second longitudinal position z2 of the first neutral region has any suitable spacing of between e.g. 25 cm and 35 cm, between 27 cm and 33 cm, etc. from a central plane at z=0 of the gradient coil unit 19.

The spacing of the first longitudinal position z1 and/or the second longitudinal position z2 and/or a mean value (z1+z2)/2 of the first longitudinal position z1 and the second longitudinal position z2 of the first neutral region 51 from a central plane at z=0 of the gradient coil unit 19, is less than the spacing of the first longitudinal position z1 and/or the second longitudinal position z2 and/or a mean value (z1+z2)/2 of the first longitudinal position z1 and the second longitudinal position z2 at a longitudinal end zmax of the gradient coil unit 19 delimiting the quadrants. The conductor structure 42 surrounds a first central point 61 and a second central point 62, each at least partially spirally and the first central point 61 and the second central point 62 are arranged outside the first neutral region 51.

The second neutral region 52 is designed such that the spatial density of the electrical conductor within the second neutral region 52 is less than the spatial density of the electrical conductor averaged over the quadrants.

The second neutral region 52 has any suitable spacing of e.g. more than 45 cm, more than 50 cm, etc. from the central plane at z=0. Alternatively and/or additionally, in the quadrant illustrated, the gradient coil unit 19 can comprise a further second neutral region 52 which has any suitable spacing of e.g. less than 15 cm, less than 12 cm, etc. from the central plane at z=0. The first neutral region 51 and the second neutral region 52 are spaced at least 10 cm from one another in the longitudinal direction z, and the second central point 52 is arranged between the first neutral region 51 and the second neutral region 52.

Figure 4:
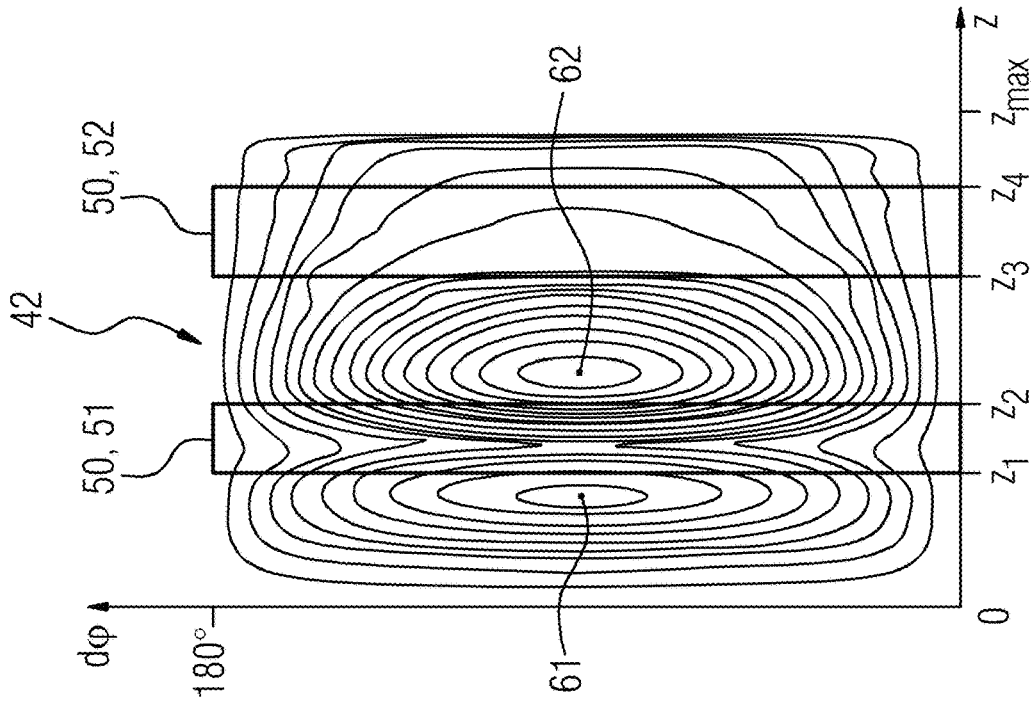
FIG. 4 shows a second embodiment of an example primary coil of a gradient coil unit according to the disclosure.

FIG. 4 shows a second embodiment of an example primary coil 41 of a gradient coil unit 19 according to the disclosure, wherein all four quadrants are illustrated. A conductor structure 42 is arranged in each quadrant. The primary coil 41 comprises the conductor structure 42 fourfold in mutually symmetrical quadrants. The primary coil 41 is typically point symmetrical about an intersection point of the four quadrants at z=0, x=0, y=0. The primary coil 41 shown is configured to generate a magnetic field gradient in the y-direction. The gradient coil unit 19 may additionally comprise the primary coil 41 shown rotated in the circumferential direction by 90° and configured to generate a magnetic field gradient in the x-direction, wherein the radius thereof relative to the cylinder axis z differs from that shown in FIG. 4 by not more than any suitable value such as e.g. not more than 10 cm, not more than 5 cm, etc.

FIG. 5 shows an embodiment of a further example primary coil 44 of a gradient coil unit 19 according to the disclosure comprising a further electrical conductor 43, which is represented in the circumferential direction in a completely unrolled form, that is for dφ=[0°, 360°]. The spatial density of the further electrical conductor 43 within the neutral regions 50, 51, 52 is less than the spatial density of the further electrical conductor 43 averaged over the quadrants [0, $z_{max}$; 0°, 180°]. For instance, the first neutral region 51 and/or the second neutral region 52 may be free of the further electrical conductor 43. In the case illustrated, the second neutral region 52 may be free of the further electrical conductor 43. The further electrical conductor 43 surrounds the cylinder axis z with a first radius at least partially spirally, wherein the first radius differs by not more than any suitable value such as e.g. not more than 10 cm from the spacing of the conductor structure 42 and/or of the primary coil 41 from the cylinder axis z. The further primary coil 44 is configured to generate a magnetic field gradient in the longitudinal direction z.

Although the disclosure has been illustrated and described in detail by way of the preferred exemplary embodiments, the disclosure is not restricted by the examples given and other variations can be derived therefrom by a person skilled in the art without departing from the protective scope of the disclosure.

The various components described herein may be referred to as "units." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units, as applicable and relevant, may alternatively be referred to herein as "circuitry," "controllers," "processors," or "processing circuitry," or alternatively as noted herein.

What is claimed is:

1. A gradient coil assembly designed as a hollow cylinder surrounding a patient receiving region in a longitudinal direction and subdivided into four quadrants, the gradient coil assembly comprising:
a primary coil comprising a conductor structure that includes a geometric arrangement of an electrical conductor with a conductor cross-section arranged within a quadrant of the four quadrants,
wherein the quadrant comprises a neutral region that is defined in the longitudinal direction between a first longitudinal position and a second longitudinal position,
wherein a current density averaged over the neutral region is less than 25% of a maximum current density averaged over the conductor cross-section within the neutral region, and
wherein the gradient coil assembly does not include a secondary coil and/or an active screening.

2. The gradient coil assembly as claimed in claim 1, wherein:
the neutral region is configured as a first neutral region,
a spatial density of the electrical conductor within the first neutral region is greater than a spatial density of the electrical conductor averaged over the four quadrants, and
the conductor structure is configured such that, upon driving the conductor structure, a portion of electric currents perpendicular to the longitudinal direction within the first neutral region that is carried by conductors within the conductor structure have an opposite direction with respect to one another.

3. The gradient coil assembly as claimed in claim 2, wherein the first longitudinal position of the first neutral region has a spacing of (i) between 15 cm and 25 cm, or (ii) between 17 cm and 23 cm, from a central plane of the gradient coil assembly.

4. The gradient coil assembly as claimed in claim 2, wherein the second longitudinal position of the first neutral region has a spacing of (i) between 25 cm and 35 cm, or (ii) between 27 cm and 33 cm, from a central plane of the gradient coil assembly.

5. The gradient coil assembly as claimed in claim 2, wherein a spacing of the first longitudinal position of the first neutral region from a central plane of the gradient coil assembly is smaller than a spacing of the first longitudinal position at a longitudinal end of the gradient coil assembly delimiting the quadrants.

6. The gradient coil assembly as claimed in claim 2, wherein a spacing of a mean value of the first longitudinal position and the second longitudinal position of the first neutral region from a central plane of the gradient coil assembly is smaller than a spacing of a mean value of the first longitudinal position and the second longitudinal position of the first neutral region at a longitudinal end of the gradient coil assembly delimiting the quadrants.

7. The gradient coil assembly as claimed claim 2, wherein the conductor structure surrounds each of a first central point and a second central point partially spirally, and
wherein the first central point and the second central point are arranged outside the first neutral region.

8. The gradient coil assembly as claimed in claim 1, wherein a spacing of the second longitudinal position from a central plane of the gradient coil assembly is smaller than a spacing of the second longitudinal position at a longitudinal end of the gradient coil assembly delimiting the quadrants.

9. The gradient coil assembly as claimed in claim 1, wherein the neutral region is configured as a second neutral region, and
wherein a spatial density of the electrical conductor within the second neutral region is less than a spatial density of the electrical conductor averaged over the quadrants.

10. The gradient coil assembly as claimed in claim 9, wherein the second neutral region has a spacing of (i) less than 15 cm from central plane of the gradient coil assembly, or (ii) more than 45 cm, from a central plane of the gradient coil assembly.

11. The gradient coil assembly as claimed in claim 1, wherein the neutral region comprises a neutral region comprises a first neutral region and a second neutral region.

12. The gradient coil assembly as claimed in claim 1, wherein the primary coil is configured to generate a magnetic field gradient in a direction perpendicular to the longitudinal direction.

13. The gradient coil assembly as claimed in claim 1, wherein the gradient coil assembly and/or the primary coil is point-symmetrical to an intersection point of the four quadrants, and
wherein the conductor structure is from among a set of four conductor structures, each of the four conductor structures being arranged within a respective quadrant.

14. The gradient coil assembly as claimed in claim 1, wherein the conductor structure is from among a set of four conductor structures, the primary coil comprising each of the set of four conductor structures.

15. The gradient coil assembly as claimed in claim 1, further comprising:
a further primary coil including a further electrical conductor that surrounds a cylinder axis of the hollow cylinder partially spirally with a first radius,
wherein the first radius differs by not more than 5 cm from a spacing of the conductor structure from the cylinder axis, and
wherein a spatial density of the further electrical conductor within the neutral region is less than a spatial density of the further electrical conductor averaged over the quadrants.

16. A magnetic resonance device, comprising:
a hollow cylindrical magnet assembly configured to generate a static main magnetic field;
a superconducting coil comprising two magnet coils and a gradient coil assembly arranged in a hollow region of the cylindrical magnet assembly,
wherein the gradient coil assembly surrounds a patient receiving region in a longitudinal direction and is subdivided into four quadrants, the gradient coil assembly comprising a primary coil comprising a conductor structure that includes a geometric arrangement of an electrical conductor with a conductor cross-section arranged within a quadrant of the four quadrants,
wherein the quadrant comprises a neutral region that is defined in the longitudinal direction between a first longitudinal position and a second longitudinal position,
wherein a current density averaged over the neutral region is less than 25% of a maximum current density averaged over the conductor cross-section within the neutral region, and
wherein the gradient coil assembly does not include a secondary coil and/or an active screening.

17. The magnetic resonance device of claim 16, wherein a first magnet coil of the two magnet coils is arranged in the longitudinal direction partially between the first longitudinal position and the second longitudinal position and surrounds the patient receiving region.

18. The magnetic resonance device as claimed in claim 16, further comprising:
a passive screening that is arranged radially between the gradient coil assembly and the superconducting coil; and
a ring structure that is arranged partially between the first longitudinal position and the second longitudinal position.

* * * * *